(12) United States Patent
Ma et al.

(10) Patent No.: US 10,945,331 B2
(45) Date of Patent: Mar. 9, 2021

(54) MOBILE DISPLAY DEVICE

(71) Applicant: BOE TECHNOLOGY GROUP CO., LTD., Beijing (CN)

(72) Inventors: Yongda Ma, Beijing (CN); Yong Qiao, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 46 days.

(21) Appl. No.: 15/572,465

(22) PCT Filed: May 10, 2017

(86) PCT No.: PCT/CN2017/083744
§ 371 (c)(1),
(2) Date: Nov. 7, 2017

(87) PCT Pub. No.: WO2017/206682
PCT Pub. Date: Dec. 7, 2017

(65) Prior Publication Data
US 2018/0235073 A1 Aug. 16, 2018

(30) Foreign Application Priority Data

May 31, 2016 (CN) .................... 2016 2 0518681 U

(51) Int. Cl.
*H05K 1/00* (2006.01)
*H05K 1/02* (2006.01)
(Continued)

(52) U.S. Cl.
CPC .......... *H05K 1/0206* (2013.01); *G06F 1/203* (2013.01); *H04M 1/0277* (2013.01);
(Continued)

(58) Field of Classification Search
CPC ...... H05K 1/0206; H05K 7/2039; G06F 1/16; G06F 1/20; G06F 1/203; H04M 1/0202
(Continued)

(56) References Cited

U.S. PATENT DOCUMENTS

| | | | |
|---|---|---|---|
| 2006/0044765 A1 | 3/2006 | Chen | |
| 2010/0072952 A1* | 3/2010 | Nakajima | H04B 1/036 320/150 |
| 2012/0044635 A1* | 2/2012 | Rothkopf | G06F 1/1626 361/679.54 |
| 2013/0329356 A1* | 12/2013 | Shanbhogue | H05K 1/144 361/679.47 |

(Continued)

FOREIGN PATENT DOCUMENTS

| | | |
|---|---|---|
| CN | 1881675 A | 12/2006 |
| CN | 202857205 U | 4/2013 |

(Continued)

OTHER PUBLICATIONS

International Search Report & Written Opinion, for PCT Patent Application No. PCT/CN2017/083744, dated Jul. 31, 2017, 9 pages.

*Primary Examiner* — Anatoly Vortman
*Assistant Examiner* — Zhengfu J Feng
(74) *Attorney, Agent, or Firm* — Kinney & Lange, P.A.

(57) ABSTRACT

Embodiments of the disclosure relate to the technical field of display, and in particular, to a mobile display device, comprising: a housing; a battery and a circuit board both provided within the housing, the battery being interposed between the circuit board and the housing, or alternatively, the battery and the circuit board being arranged side by side; a chip provided on the circuit board; a heat dissipation unit which is also provided on the circuit board and is configured to dissipate heat from the chip; and a first thermally-conductive connector which connects the heat dissipation unit with the housing.

12 Claims, 3 Drawing Sheets

(51) Int. Cl.
*H05K 7/20* (2006.01)
*H04M 1/02* (2006.01)
*G06F 1/20* (2006.01)

(52) U.S. Cl.
CPC ....... *H05K 7/2039* (2013.01); *H05K 7/20445* (2013.01); *H04M 1/0202* (2013.01); *H04M 1/0262* (2013.01); *H04M 1/0266* (2013.01); *H05K 1/0209* (2013.01); *H05K 2201/066* (2013.01); *H05K 2201/10037* (2013.01)

(58) Field of Classification Search
USPC ........................................................ 361/704
See application file for complete search history.

(56) References Cited

U.S. PATENT DOCUMENTS

| | | | | |
|---|---|---|---|---|
| 2014/0009891 | A1* | 1/2014 | Chen | H05K 7/2039 361/720 |
| 2015/0075186 | A1* | 3/2015 | Prajapati | G06F 1/20 62/3.7 |
| 2015/0295141 | A1* | 10/2015 | Schwarz | H01L 33/486 362/296.01 |
| 2016/0004284 | A1* | 1/2016 | Cohen | G06F 1/20 361/679.54 |
| 2018/0068926 | A1* | 3/2018 | Krajniak | H01L 21/77 |

FOREIGN PATENT DOCUMENTS

| | | |
|---|---|---|
| CN | 203691838 U | 7/2014 |
| CN | 104619146 A | 5/2015 |
| CN | 205809778 U | 12/2016 |

* cited by examiner

MOBILE DISPLAY DEVICE

CROSS-REFERENCE TO RELATED INVENTION

The present disclosure claims the benefit of Chinese Patent Application Invention No. 201620518681.5 filed on May 31, 2016 in the State Intellectual Property Office of China, the whole disclosure of which is incorporated herein by reference.

BACKGROUND OF THE DISCLOSURE

Field of the Disclosure

Embodiments of the present disclosure relate to the technical field of display, and in particular, to a mobile display device.

Description of the Related Art

With a continuous development of mobile devices such as smartphone, laptop computer and the like, functionalities of the mobile devices become more and more sophisticated and complete, resulting in an even longer operation time thereof by users.

By way of example, heat dissipation components of a mobile device mainly comprise a housing, a battery, a circuit board, a chip and an ambient environment. And an average temperature among various components of the mobile device and a heat distribution condition inside the mobile device may exert great influence on both reliability and safety of the mobile device. As a result, heat produced by the battery in an existing mobile device may be transferred to the housing of the mobile device, mainly by heat radiation and heat conduction, and then be dissipated through the housing.

However, as to a mobile device in the prior art, provided that a housing thereof is provided with a relatively low coefficient of heat conductivity, then both a disequilibrium in heat dissipation and relatively high local temperature of the battery may thus be brought about, resulting in a reduced service life of the mobile device eventually.

SUMMARY OF THE DISCLOSURE

The embodiments of the present disclosure have been made to overcome or alleviate at least one aspect of the above mentioned disadvantages and/or shortcomings in the prior art, by providing a mobile display device, so as to decrease occurrence of a phenomenon of a relatively high local temperature of the battery, such that the equilibrium of heat dissipation of the mobile display device may be improved and an extended service life of the battery may also be obtained.

Following technical solutions are adopted in exemplary embodiments of the invention for achieving the above desired technical purposes.

According to an aspect of the exemplary embodiment of the present disclosure, there is provided a mobile display device provided with a housing. And the mobile display device further comprises: a battery and a circuit board both provided within the housing, the battery being interposed between the circuit board and the housing, or alternatively, the battery and the circuit board being arranged side by side; a chip provided on the circuit board; a heat dissipation unit which is also provided on the circuit board and is configured to dissipate heat from the chip; and a first thermally-conductive connector which connects the heat dissipation unit with the housing.

In some optional embodiments, the first thermally-conductive connector is one of a thermally-conductive adhesive and a metallic thermally-conductive sheet which is provided with an electrically-insulative and thermally-conductive layer.

In some optional embodiments, the first heat-conductive connector overlaps with the battery at least partially, in a direction perpendicular to a display side of the mobile display device.

In some optional embodiments, the mobile display device further comprises a second thermally-conductive connector which connects the circuit board with the housing.

In some optional embodiments, the second thermally-conductive connector is one of a thermally-conductive adhesive and a metallic thermally-conductive sheet which is provided with an electrically-insulative and thermally-conductive layer.

In some optional embodiments, the mobile display device further comprises a third thermally-conductive connector which is interposed and connected between the chip and the heat dissipation unit.

In some optional embodiments, the third thermally-conductive connector is one of a thermally-conductive adhesive, a thermally-conductive ceramic, and a metallic thermally-conductive sheet which is provided with an electrically-insulative and thermally-conductive layer.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION OF PREFERRED EMBODIMENTS OF THE INVENTION

Figure 1:
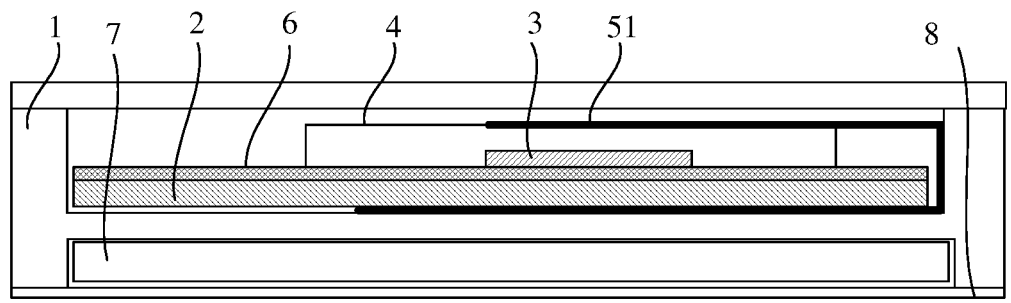
FIG. 1 illustrates a schematic sectional view of a first construction of a mobile display device, according to an exemplary embodiment of the disclosure.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of the mobile display device.

As illustrated in FIG. 1 which illustrates a schematic sectional view of a first construction of a mobile display device, according to an exemplary embodiment of the disclosure. There is provided a mobile display device in an exemplary embodiment of the disclosure, as illustrated in FIG. 1, comprising a housing 1; and the mobile display device further comprises:

a battery 2 and a circuit board 6 both provided within the housing 1, the battery 2 being interposed between the circuit board 6 and the housing 1;

a chip 3 provided on the circuit board 6;

a heat dissipation unit 4 which is also provided on the circuit board 6 and is configured to dissipate heat from the chip 3; and a first thermally-conductive connector 51 which connects the heat dissipation unit 4 with the housing 1.

Figure 4:
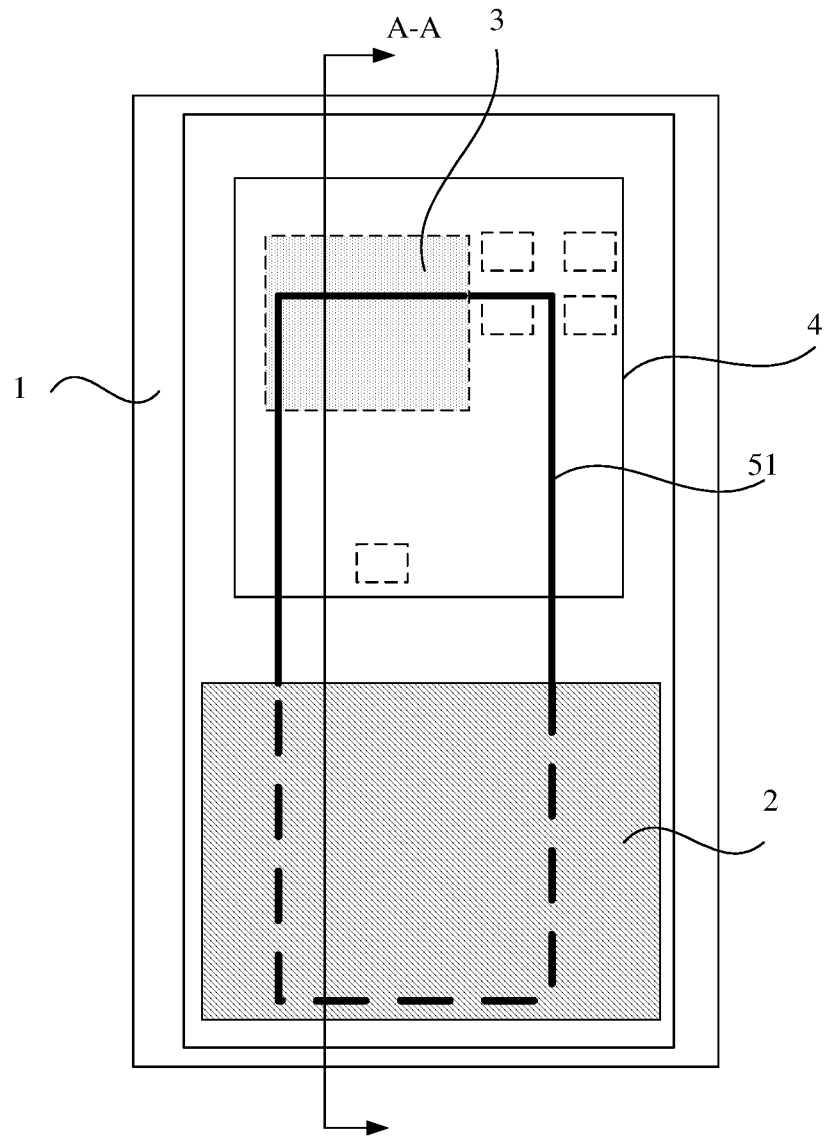
FIG. 4 illustrates a schematic sectional view of a fourth construction of a mobile display device, according to an exemplary embodiment of the disclosure.
Figure 5:
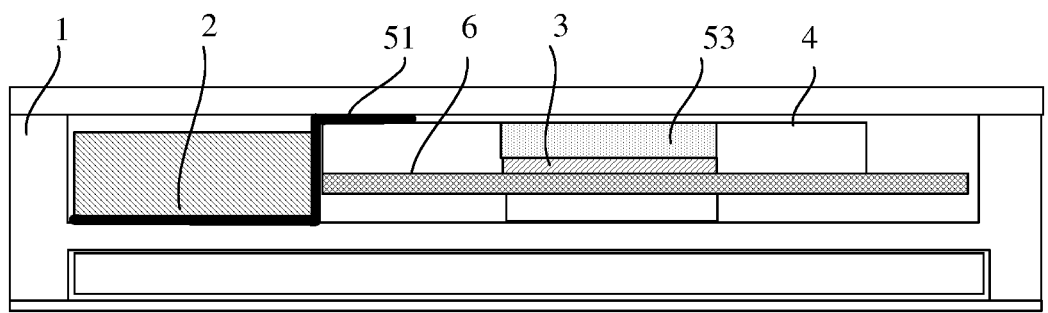
FIG. 5 illustrates a sectional view at A-A cross section as illustrated in the schematic sectional view of the fourth construction of the mobile display device, according to an exemplary embodiment of the disclosure.

As illustrated in FIGS. 4 and 5, FIG. 4 illustrates a schematic sectional view of a fourth construction of a mobile display device according to an exemplary embodiment of the disclosure and FIG. 5 illustrates a sectional view at A-A cross section as illustrated in the schematic sectional view of the fourth construction of the mobile display device according to an exemplary embodiment of the disclosure, there is provided another mobile display device in an exemplary embodiment of the disclosure, comprising a housing 1; and the mobile display device further comprises:

a battery 2 and a circuit board 6 both provided within the housing 1, the battery 2 and the circuit board 6 being arranged side by side;

a chip 3 provided on the circuit board 6;

a heat dissipation unit 4 which is also provided on the circuit board 6 and is configured to dissipate heat from the chip 3; and a first thermally-conductive connector 51 which connects the heat dissipation unit 4 with the housing 1.

By any one of above mobile display devices provided by exemplary embodiments of the disclosure, the battery 2 may transfer electrical energy to the chip 3 through the circuit board 6. Since in a process of producing the electrical energy, both the battery and the chip may generate heat respectively, then, by provision of the first thermally-conductive connector 51 for connecting the heat dissipation unit 4 with the housing 1, the heat thus generated by the battery 2 and the chip 3 may for example be transferred through the first thermally-conductive connector 51 and then to the housing 1 and the heat dissipation unit 4 respectively so as to implement a heat balance or thermal equilibrium by neutralization of heat between the housing 1 and the heat dissipation unit 4. In other words, when a temperature of the battery is excessively high, heat may be dissipate from the housing 1 and may also be transferred through the first thermally-conductive connector 51 to the heat dissipation unit 4 for dissipating outwards therefrom simultaneously, resulting in an enhanced heat dissipation efficiency of the mobile display device.

As such, the mobile display device provided by the embodiments of the disclosure, may decrease occurrence of a phenomenon of a relatively high local temperature of the battery 2, such that the equilibrium of heat dissipation of the mobile display device may be improved and an extended service life of the battery 2 may also be obtained.

As illustrated in FIG. 1, by way of example, the mobile display device as illustrated above may further comprises a display module 7 and a cover plate 8 which covers the display module 7 at its display side, and the like.

The first thermally-conductive connector 51 may be formed by one or more of various specific materials, for example, the first thermally-conductive connector 51 may be a thermally-conductive adhesive, or a metallic thermally-conductive sheet which is provided with an electrically-insulative and thermally-conductive layer. Of course, specific material(s) of the first thermally-conductive connector may not be limited to the materials as exemplified as above, without repeating herein any more.

As illustrated in FIG. 5 and FIG. 1, in a direction perpendicular to the display side, the first heat-conductive connector 51 overlaps with the battery 2 at least partially therebetween.

Figure 2:
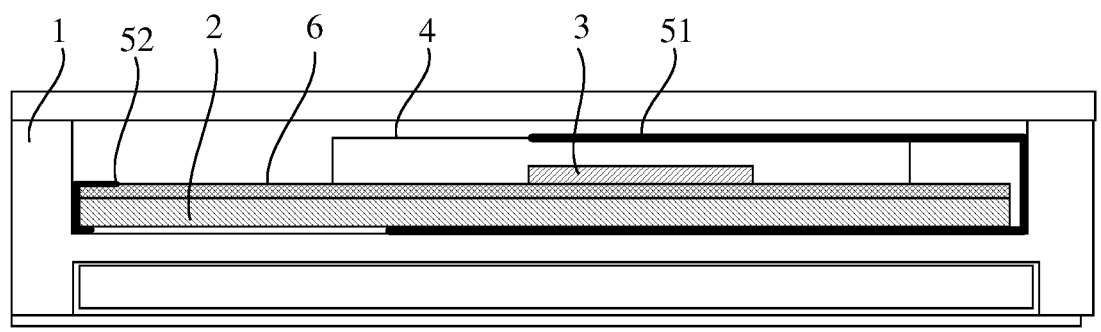
FIG. 2 illustrates a schematic sectional view of a second construction of a mobile display device, according to an exemplary embodiment of the disclosure.

As illustrated in FIG. 2, FIG. 2 illustrates a schematic sectional view of a second construction of a mobile display device, according to an exemplary embodiment of the disclosure. The mobile display device may further comprises a second thermally-conductive connector 52 which connects the circuit board 6 with the housing 1. Since a portion of the heat generated by the chip 3 may be transferred to the heat dissipation unit 4 while another portion of the heat generated by the chip 3 may be transferred to the circuit board 6, then, then, by provision of the second thermally-conductive connector 52, the heat received by the circuit board 6 may for example be transferred therethrough and then to the housing 1. This is due to the fact that, due to the fact that heat may be transferred from a location having a relatively high temperature to another location having a relatively low temperature during heat transfer, then, provided that the temperate of the battery 2 is relatively low, a portion of the heat from the housing 1 may be transferred to the battery 2 such that the temperature of battery 2 may be elevated swiftly to its operation temperature and a conversion efficiency of electrical energy of the battery 2 may in turn be enhanced.

In an embodiment of this disclosure, e.g., the second thermally-conductive connector 52 may be a thermally-conductive adhesive, or a metallic thermally-conductive sheet which is provided with an electrically-insulative and thermally-conductive layer. Of course, specific material(s) of the second thermally-conductive connector may not be limited to the materials as exemplified as above, without repeating herein any more.

Figure 3:
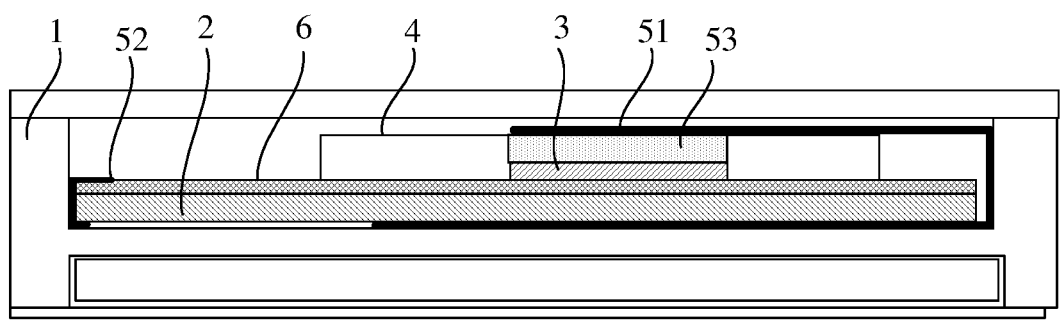
FIG. 3 illustrates a schematic sectional view of a third construction of a mobile display device, according to an exemplary embodiment of the disclosure.

As illustrated in FIG. 3, FIG. 3 illustrates a schematic sectional view of a third construction of a mobile display device, according to an exemplary embodiment of the disclosure. The mobile display device may further comprise a third thermally-conductive connector 53 which is interposed and connected between the chip 3 and the heat dissipation unit 4. By provision of the third thermally-conductive connector 53, it may accelerate a heat transfer rate or speed from the chip 3 to the heat dissipation unit 4.

In an embodiment of the disclosure, by way of example, the third thermally-conductive connector 53 may be a thermally-conductive adhesive, a thermally-conductive ceramic, or a metallic thermally-conductive sheet which is provided with an electrically-insulative and thermally-conductive layer. Of course, specific material(s) of the third thermally-conductive connector may not be limited to the materials as exemplified as above, without repeating herein any more.

Figure 6:
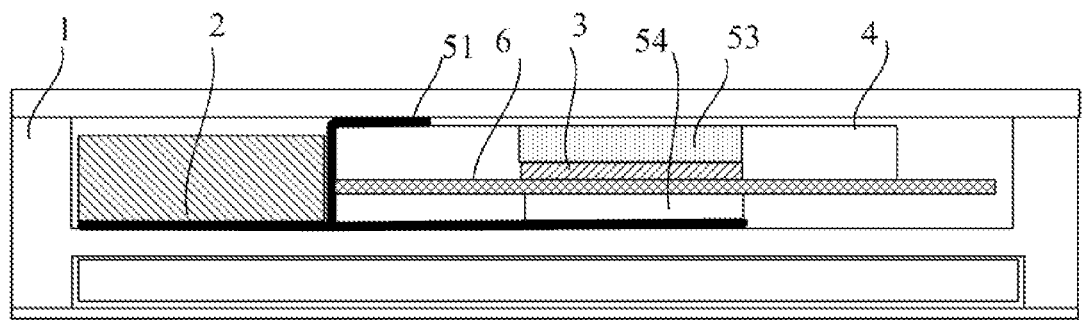
FIG. 6 illustrates a schematic sectional view of a fifth construction of a mobile display device, according to an exemplary embodiment of the disclosure.

As illustrated in FIG. 6, FIG. 6 illustrates a schematic sectional view of a fifth construction of a mobile display device, according to an exemplary embodiment of the disclosure. In order to facilitate that the temperature of the battery 2 in a low-temperature environment is elevated swiftly to its operation temperature, provided that the battery and the circuit board are arranged side by side, the mobile display device further comprises a fourth thermally-conductive connector 54 which connects the battery with the circuit board and conducts heat therebetween. By way of example, as illustrated, the fourth thermally-conductive connector connects the battery with the circuit board and conducts heat therebetween, indirectly via the first thermally-conductive connector.

Above mobile display device may for example be mobile phone, laptop computer, or other mobile display device(s).

The mobile display device provided by the embodiments of the disclosure may decrease occurrence of a phenomenon of a relatively high local temperature of the battery 2, such that the equilibrium of heat dissipation of the mobile display device may be improved and an extended service life of the battery 2 may also be obtained.

It would be appreciated by those skilled in the art that various changes or modifications may be made in these embodiments without departing from the principles and spirit of the disclosure and lie within the scope of present application, which scope is defined in the claims and their equivalents.

What is claimed is:

1. A mobile display device provided with a housing, wherein the mobile display device further comprises:
    a battery and a circuit board both provided within the housing, the battery being interposed between the circuit board and the housing in a thickness direction of the mobile display device and being abutting at both sides thereof against the circuit board and the housing, respectively;
    a chip provided on the circuit board;
    a heat dissipation unit which is also provided on the circuit board and is configured to dissipate heat from the chip; and
    a first thermally-conductive connector which connects the heat dissipation unit with the housing;
    wherein the mobile display device further comprises a supplemental thermally-conductive connector which connects the battery with the circuit board and conducts heat therebetween, indirectly merely via the first thermally-conductive connector, without any thermal conductor between the first thermally-conductive connector and the supplemental thermally-conductive connector.

2. The mobile display device according to claim 1, wherein the first thermally-conductive connector is a metallic thermally-conductive sheet which is provided with an electrically-insulative and thermally-conductive layer.

3. The mobile display device according to claim 1, wherein the first thermally-conductive connector overlaps with the battery at least partially therebetween, in a direction perpendicular to a display side of the mobile display device.

4. The mobile display device according to claim 1, further comprising a second thermally-conductive connector which connects the circuit board with the housing.

5. The mobile display device according to claim 4, wherein the second thermally-conductive connector is a metallic thermally-conductive sheet which is provided with an electrically-insulative and thermally-conductive layer.

6. The mobile display device according to claim 1, further comprising a third thermally-conductive connector which is interposed and connected between the chip and the heat dissipation unit.

7. The mobile display device according to claim 2, further comprising a third thermally-conductive connector which is interposed and connected between the chip and the heat dissipation unit.

8. The mobile display device according to claim 3, further comprising a third thermally-conductive connector which is interposed and connected between the chip and the heat dissipation unit.

9. The mobile display device according to claim 4, further comprising a third thermally-conductive connector which is interposed and connected between the chip and the heat dissipation unit.

10. The mobile display device according to claim 5, further comprising a third thermally-conductive connector which is interposed and connected between the chip and the heat dissipation unit.

11. The mobile display device according to claim 6, wherein the third thermally-conductive connector is a metallic thermally-conductive sheet which is provided with an electrically-insulative and thermally-conductive layer.

12. A mobile display device provided with a housing, wherein the mobile display device further comprises:
    a battery and a circuit board both provided within the housing, the battery being interposed between the circuit board and the housing, or alternatively, the battery and the circuit board being arranged side by side;
    a chip provided on the circuit board;
    a heat dissipation unit which is also provided on the circuit board and is configured to dissipate heat from the chip; and
    a first thermally-conductive connector which connects the heat dissipation unit with the housing;
    wherein the mobile display device further comprises a supplemental thermally-conductive connector which connects the battery with the circuit board and conducts heat therebetween, indirectly merely via the first thermally-conductive connector, without any thermal conductor between the first thermally-conductive connector and the supplemental thermally-conductive connector.

\* \* \* \* \*